(12) United States Patent
Reiss et al.

(10) Patent No.: US 11,373,936 B2
(45) Date of Patent: Jun. 28, 2022

(54) FLAT NO-LEADS PACKAGE, PACKAGED ELECTRONIC COMPONENT, PRINTED CIRCUIT BOARD AND MEASUREMENT DEVICE

(71) Applicant: Rohde & Schwarz GmbH & Co. KG, Munich (DE)

(72) Inventors: Simon Reiss, Munich (DE); Chris Haehnlein, Lengdorf (DE); Robert Ziegler, Surberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 138 days.

(21) Appl. No.: 16/683,778

(22) Filed: Nov. 14, 2019

(65) Prior Publication Data

US 2021/0151363 A1 May 20, 2021

(51) Int. Cl.
*H01L 23/495* (2006.01)
*H01L 23/66* (2006.01)
(Continued)

(52) U.S. Cl.
CPC ...... *H01L 23/49541* (2013.01); *H01L 23/315* (2013.01); *H01L 23/3121* (2013.01);
(Continued)

(58) Field of Classification Search
CPC combination set(s) only.
See application file for complete search history.

(56) References Cited

U.S. PATENT DOCUMENTS 5,072,189 A * 12/1991 Openlander ........... G01R 27/28
324/638
5,559,306 A * 9/1996 Mahulikar .............. H01L 23/16
174/521
(Continued)

FOREIGN PATENT DOCUMENTS

| CN | 104167400 A | 11/2014 |
| CN | 209016044 U | 6/2019 |
| EP | 3 046 145 A1 | 7/2016 |

OTHER PUBLICATIONS

Hitzler, Martin et al., "Radiation Pattern Optimization for QFN Packages With On-Chip Antennas at 160 GHz", 4552 IEEE Transactions on Antennas and Propagation, vol. 66, No. 9, Sep. 2018, 0018-926X © 2018 IEEE. Personal use is permitted, but republication/redistribution requires IEEE permission. See http://www.ieee.org/publications_standards/publications/rights/index.html for more information; 11 pages.

*Primary Examiner* — Anthony Ho
*Assistant Examiner* — Kevin Quinto
(74) *Attorney, Agent, or Firm* — Westman, Champlin & Koehler, P.A.

(57) ABSTRACT

A flat no-leads package, the flat no-leads package includes a leadframe for electrically connecting an integrated circuit (IC) chip which in a mounted configuration is arranged in a center portion of the flat no-leads package. The leadframe has at least one RF lead pin; and an isolating encapsulation which is at least partially encapsulating the leadframe such that contact surfaces of the leadframe are electrically contactable at least from a bottom side of the flat no-leads package; wherein at least one of the RF lead pin has a first and second contact surfaces. A cross-section of the RF lead pin increases from the first contact surface to the second contact surface both in a horizontal direction and in a direction vertical thereto. Further, a printed circuit board (Continued)

having a flat no-leads package and a measurement device having a flat no-leads package are provided.

15 Claims, 7 Drawing Sheets

(51) Int. Cl.
 *H01L 23/31* (2006.01)
 *H01L 23/00* (2006.01)
 *G01R 31/28* (2006.01)
(52) U.S. Cl.
 CPC ........ *H01L 23/49531* (2013.01); *H01L 23/66* (2013.01); *H01L 24/48* (2013.01); *H01L 24/49* (2013.01); *G01R 31/2822* (2013.01); *H01L 2223/6611* (2013.01); *H01L 2224/48091* (2013.01); *H01L 2224/48106* (2013.01); *H01L 2224/48247* (2013.01); *H01L 2224/49171* (2013.01)

(56) References Cited

U.S. PATENT DOCUMENTS

| | | | | |
|---|---|---|---|---|
| 5,723,902 | A * | 3/1998 | Shibata | H01L 23/49548 257/692 |
| 6,249,041 | B1 * | 6/2001 | Kasem | H01L 23/4951 257/666 |
| 9,704,785 | B2 | 7/2017 | Hsieh et al. | |
| 9,966,652 | B2 | 5/2018 | Mangrum et al. | |
| 2001/0015485 | A1 * | 8/2001 | Song | H01L 23/055 257/679 |
| 2008/0272475 | A1 * | 11/2008 | Dijkstra | H01L 23/315 257/682 |
| 2010/0219518 | A1 * | 9/2010 | Hsu | H01L 23/4951 257/676 |
| 2016/0148877 | A1 | 5/2016 | Kitnarong et al. | |
| 2016/0204053 | A1 | 7/2016 | Hsieh et al. | |
| 2017/0125881 | A1 | 5/2017 | Mangrum et al. | |

* cited by examiner

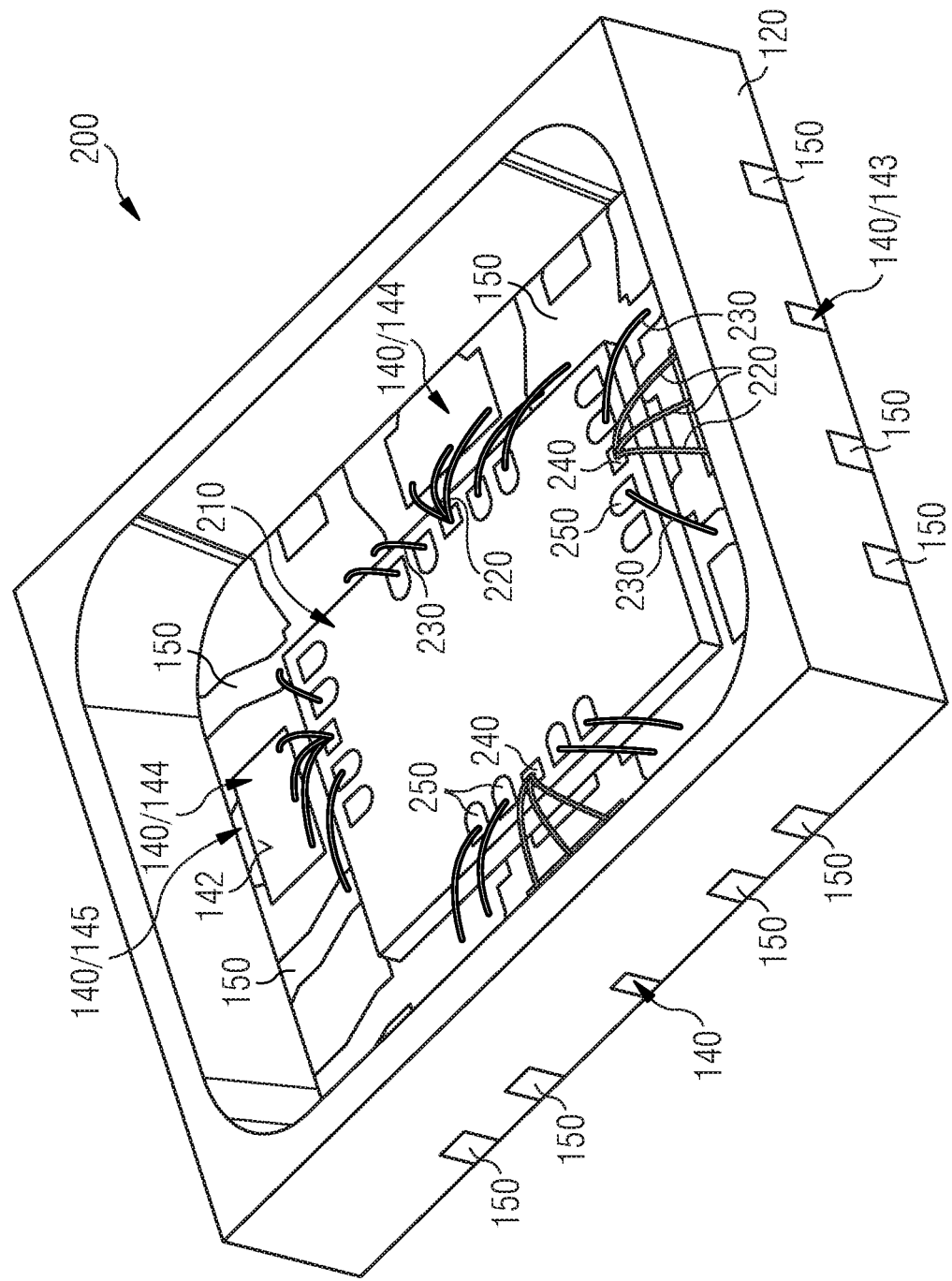

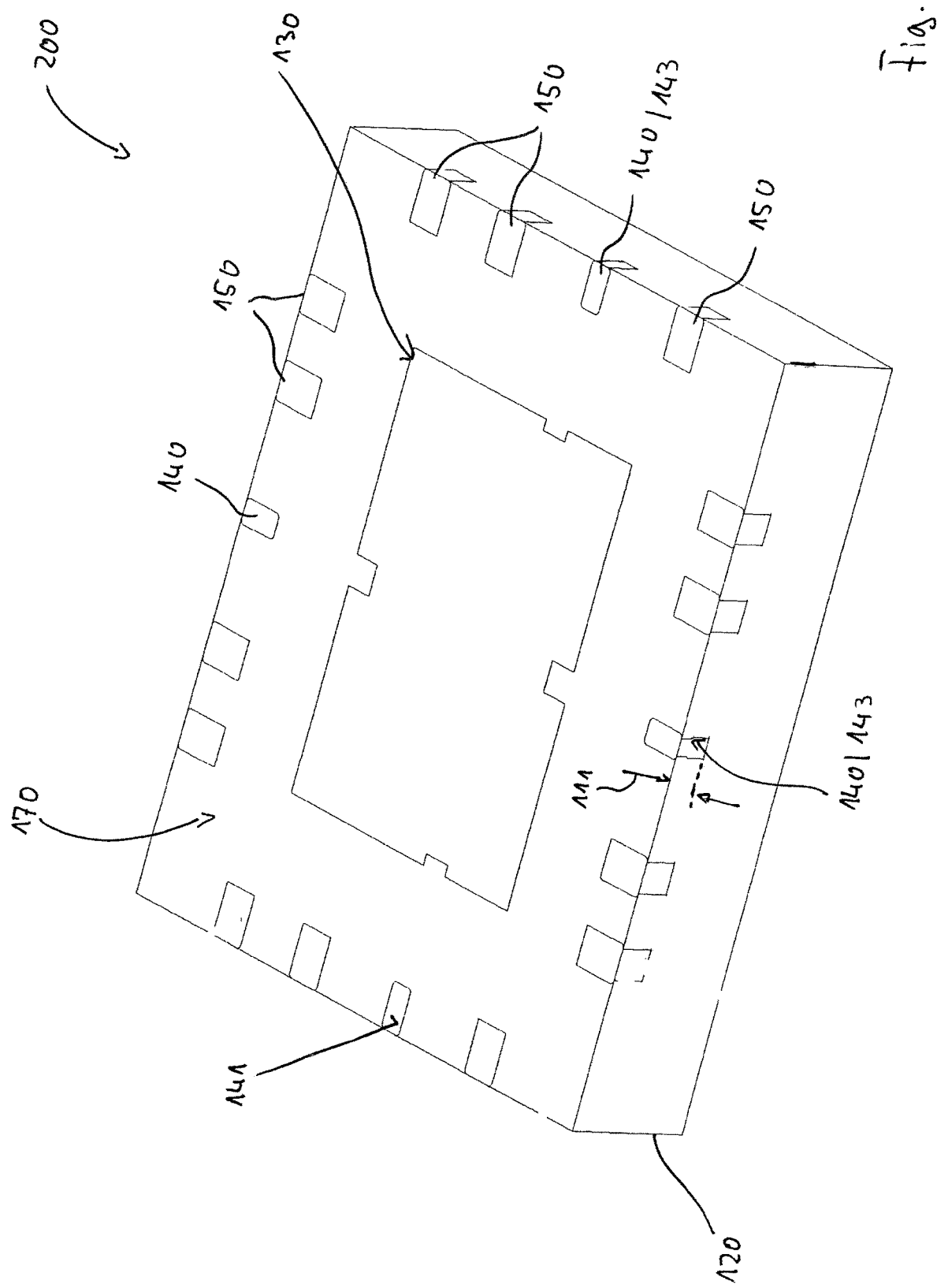

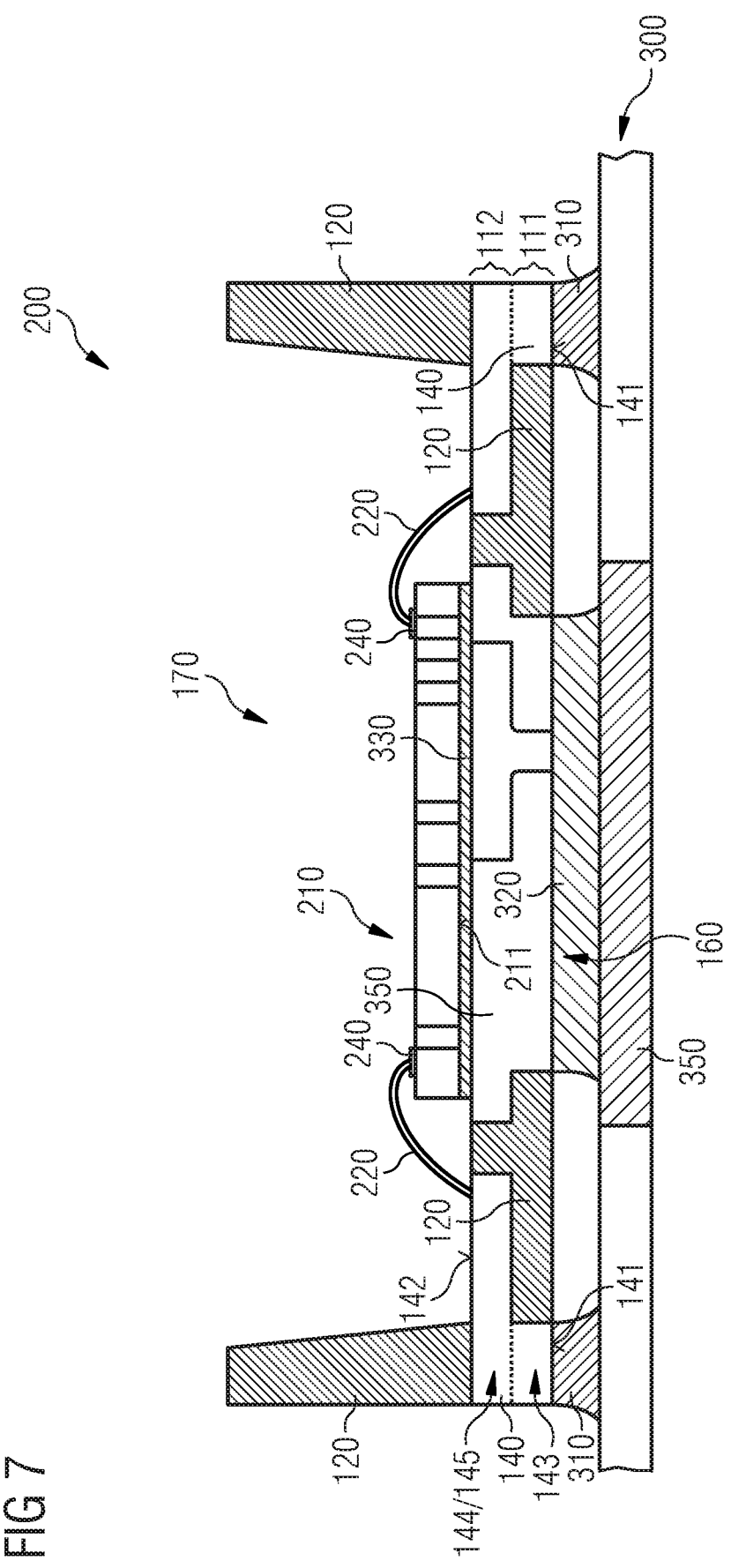

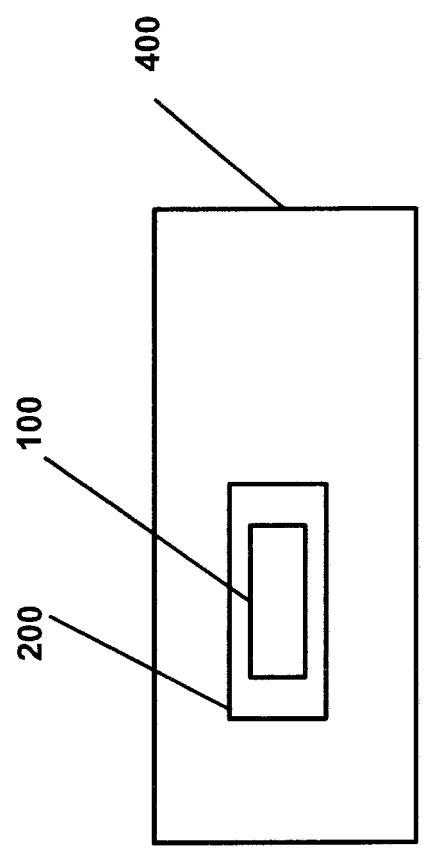

FLAT NO-LEADS PACKAGE, PACKAGED ELECTRONIC COMPONENT, PRINTED CIRCUIT BOARD AND MEASUREMENT DEVICE

FIELD OF THE INVENTION

The present invention relates to a flat no-leads package. The invention further relates to a packaged electronic component, a printed circuit board having a flat no-leads package and a measurement device having a flat no-leads package.

TECHNICAL BACKGROUND

Flat no-leads packaging refers to a specific type of integrated circuit (IC) packaging with integrated pins for surface mounting to a printed circuit board (PCB). Flat no-leads may sometimes be also referred to as micro leadframes (MLF). Flat no-leads packages, including for example quad-flat no-leads (QFN) and dual-flat no-leads (DFN), provide physical and electrical connection between an encapsulated IC component and an external circuit, such as a PCB.

A QFN package is for example disclosed in US 2016/0148877 A1.

In general, the contact pins for a flat no-leads package do not extend beyond the edges of the package. The pins are usually formed by a single leadframe that includes a central support structure for the die of the IC. The leadframe and IC are encapsulated in an electrically isolating housing, typically made of plastic. This type of package offers a variety of benefits including reduced lead inductance, a small sized near chip scale footprint, thin profile and low weight. It also uses perimeter I/O pads to ease PCB trace routing, and the exposed copper die-pad technology offers good thermal and electrical performance. These properties make the flat no-leads package a good choice for many new applications where size, weight, and thermal and electrical performance are important.

However, the electronics industry has pushed the development of more complex packages that extend the performance of the materials of ICs in order to meet the more stringent needs of the developing RF and power component markets. Liquid Crystal Polymers (LCP) packages, laminate packages or ceramic packages are providing better performances common in industry. For example, LCP is the choice for plastic body components and connectors, developed to suit temperatures of 300 degrees Celsius and above. This means that packages made with such materials can withstand the typical reflow soldering processes used in high-volume system manufacturing. Due to comparably low manufacturing tolerances and minimum structure size of these specific package types, RF packages up to 50 GHz are possible. However, such specific package types are significantly more expensive than conventional packages such as the aforementioned standard flat no-leads package. Those less-expensive conventional plastic-moulded flat no-leads packages are usually limited to applications up to about 2-25 GHz. Due to their construction, more expensive air cavity quad flat no-leads (AQFN) packages presently can be used for RF applications up to 20-25 GHz.

This is a situation that needs to be improved.

SUMMARY OF THE INVENTION

Against this background, there is a need to provide a cost-effective flat no-leads package that is also suitable for higher RF frequencies.

The present invention provides a flat no-leads package, by a packaged electronic component, by a printed circuit board and/or by a measurement device having the features of the independent claims.

According to aspects of the present invention, the following is provided:

A flat no-leads package, the flat no-leads package comprising: a leadframe for electrically connecting an integrated circuit (IC) chip which in a mounted configuration is arranged in a center portion of the flat no-leads package, the leadframe comprising at least one RF lead pin; and an isolating encapsulation which is at least partially encapsulating the leadframe such that contact surfaces of the leadframe are electrically contactable at least from a bottom side of the flat no-leads package; wherein at least one of the RF lead pin has a first contact surface for providing an external contacting and a second contact surface for enabling an internal wire bonding to an IC chip inside the flat no-leads package, and wherein the cross-section of the RF lead pin increases from the first contact surface to the second contact surface both in a horizontal direction and in a direction vertical thereto.

A packaged electronic component, the packaged electronic component comprising: a flat no-leads package, the flat no-leads package comprising: a leadframe for electrically connecting an IC chip comprising at least one RF lead pin and at least one leadframe ground, an isolating encapsulation which is at least partially encapsulating the leadframe such that contact surfaces of the leadframe are electrically contactable at least from a bottom side of the flat no-leads package; and an IC chip arranged at least partially within the isolating encapsulation, mounted in a center portion of the flat no-leads package and electrically connected via wire bonds to the leadframe; wherein at least one of the RF lead pin has a first contact surface for providing an external contacting and a second contact surface for enabling an internal wire bonding to the electronic circuit inside the flat no-leads package; and wherein the cross-section of the RF lead pin increases from the first contact surface to the second contact surface both in a horizontal direction and in a direction vertical thereto.

A printed circuit board (PCP), the PCB comprising: an insulating plate; at least one flat no-leads package mounted on the insulating plate, the flat no-leads package comprising: a leadframe for electrically connecting an IC chip which in a mounted configuration is arranged in a center portion of the flat no-leads package, the leadframe comprising at least one RF lead pin; and an isolating encapsulation which is at least partially encapsulating the leadframe such that contact surfaces of the leadframe are electrically contactable at least from a bottom side of the flat no-leads package; wherein at least one of the RF lead pin has a first contact surface for providing an external contacting and a second contact surface for enabling an internal wire bonding to an electronic circuit inside the flat no-leads package; and wherein the cross-section of the RF lead pin increases from the first contact surface to the second contact surface both in a horizontal direction and in a direction vertical thereto.

A measurement device comprising at least one flat no-leads package, the flat no-leads package comprising: a leadframe for electrically connecting an IC chip which in a mounted configuration is arranged in a center portion of the flat no-leads package, the leadframe comprising at least one RF lead pin; and an isolating encapsulation which is at least partially encapsulating the leadframe such that contact surfaces of the leadframe are electrically contactable at least from a bottom side of the flat no-leads package; wherein at least one of the RF lead pin has a first contact surface for providing an external contacting and a second contact surface for enabling an internal wire bonding to an electronic circuit inside the flat no-leads package; and wherein the cross-section of the RF lead pin increases from the first contact surface to the second contact surface both in a horizontal direction and in a direction vertical thereto.

The present invention is based on the concept of smartly adapting a flat no-leads package in standard manufacturing process with a specially developed customized leadframe. The flat no-leads package consists of a typically copper-based leadframe and an isolating encapsulation. The structure of this leadframe is now optimized such that an RF compensation for the leadframe is shifted inside the package itself through an optimized design of the leadframe, while maintaining a basically standard flat no-leads footprint on the outside. From the outside, the leadframe footprint looks like a standard leadframe.

According to the present invention, the parasitic inductances and capacities caused by the leadframe and the wire bonds, which are particularly effective in an RF operation mode, are reduced by optimizing the leadframe internally of the package. The optimization targets a suitable 3-dimensional design of the leadframe, i.e. a suitable lateral and vertical structuring of different portions of the leadframe, in order to compensate the parasitic inductances and capacitances of the leadframe and the wire bonds as far as possible, so that the electronic component mounted inside flat no-leads package can be used for very high RF ranges. In particular, the RF lead pins of the leadframe are designed in such a way that they largely compensate the wire inductances and capacitances caused by the wire bonds. This way, a cost-effective package in a standard manufacturing process with standard compliant footprint on a PCB is provided. The package according to the present invention offers full compatibility with standard flat no-leads package assembly techniques.

The specific idea of this invention is to provide a multi-level structure of a RF lead pin. The effective cross-section of the RF lead pin is expanded, i.e. enlarged, from the outside of the package to the inside both in a lateral and vertical direction. In addition, the effective cross-section of the RF lead pin is also enlarged from a lower level of the leadframe to an upper level of the leadframe.

The invention enables to extend the RF performance of a packaged electronic component to more than 45 GHz. With standard flat no-leads packages, the RF compensation is usually provided outside the package, e.g. at the PCB level, and thus at a greater distance from the interference of the wire bonds. The idea of the present invention is how to shift the RF compensation inside the structure of the flat no-leads package and in particular very close to the location of the wire bonds. With the presented flat no-leads packages, external compensation is no longer necessary, however, can be additionally used to further optimize the RF performance.

Advantageous configurations and developments emerge from the further dependent claims and from the description with reference to the figures of the drawings.

In a preferred embodiment, the flat no-leads package is a quad flat no-leads (QNF) package. It is usually composed of just two parts, a plastic compound and a copper leadframe, and does not come with a lid. It goes without saying that other materials are possible either.

In a specific preferred embodiment, the QNF package is an air cavity quad flat no-leads (AQNF) package. The AQNF package additionally comprises an air cavity inside the package. Inside, the AQFN package is hollow, i.e. the IC chip is not additionally encapsulated. The AQFN package is usually made up of three parts: a leadframe (e.g. of copper), a body (typically plastic-moulded, open and not sealed), and either a ceramic or plastic lid. The lid of the AQNF package is part of the isolating encapsulation and is intended to cover and protect the electronic circuit inside the AQNF package.

In a further preferred configuration, the lid of the AQNF package comprises ceramic.

In a further preferred configuration, at least one RF lead pin of the leadframe is comprised of a first portion, a second portion and a third portion. The first portion at an outer side of the RF lead pin is designed to provide via the first contact surface an electrical contactibility to the electronic circuit inside the flat no-leads package. The second portion at an inner side of the RF lead pin comprises the second contact surface for providing wire bond contactibility from the RF lead pin to a corresponding bond pad of an IC chip mounted inside the flat no-leads package. The first portion exhibits a smaller cross-sectional area than the second portion. The third portion is electrically arranged between and electrically coupling the first portion with the second portion.

In a preferred embodiment, at least one of the first portion and second portion has a basically rectangular shape which are preferably designed such to effect and improve the inductive and/or capacitive characteristics.

In a further preferred embodiment, at least one of the first portion and second portion has at least one rounded corner which are preferably designed such to effect and improve the inductive and/or capacitive characteristics.

In a further preferred configuration, the third portion has a trapezoidal shape. The longer side of the both parallel sides of the trapezoidal shaped third portion is bordering alongside the second portion and the shorter side of the both parallel sides of the trapezoidal shaped third portion is bordering alongside the first portion.

In a further configuration, the transition between the second portion and the third portion is discontinuous.

According to a typical configuration the isolating encapsulation is encapsulating the leadframe such that only the first portion of the leadframe is electrically contactable from the bottom side of the package.

According to a further configuration, the leadframe further comprises at least one leadframe ground pin which is arranged adjacent to at least one of the RF lead pins.

In a preferred embodiment, a gap between the leadframe ground pin and the RF lead pin is filled with the same material of the isolating encapsulation.

In a further embodiment, the material of the isolating encapsulation at least partially and preferably completely comprises plastic.

In a further embodiment, the isolating encapsulation is injection moulded. Preferably, a two-component moulding process is employed where the isolating encapsulation is moulded together with the leadframe.

In a particular preferred configuration of the packaged electronic component, at least one of the RF lead pin is electrically connected via the second surface to a corresponding bond-pad of the IC chip by means of at least three wire bonds.

According to a preferred configuration, the RF lead pin and the leadframe ground are configured such that during operation of the IC chip a potential of the RF lead pin corresponds basically to a potential of the leadframe ground pin.

In a further embodiment, the leadframe ground pin is designed with regard to its lateral dimension, length, effective surface area and/or arrangement such to basically compensate the electrically imperfection of the wire bonds such as the inductivity of the wire bonds.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which:

FIG. 5 shows a perspective top view of an embodiment of a packaged electronic component according to the invention;

FIG. 6 shows a perspective bottom view of an embodiment of the packaged electronic component of FIG. 5;

FIG. 7 shows a cross-sectional side view of a packaged electronic component on a printed circuit board (PCB) according to the invention; and FIG. 8 shows a block diagram of an embodiment of a measurement device according to the invention.

Figure 1:
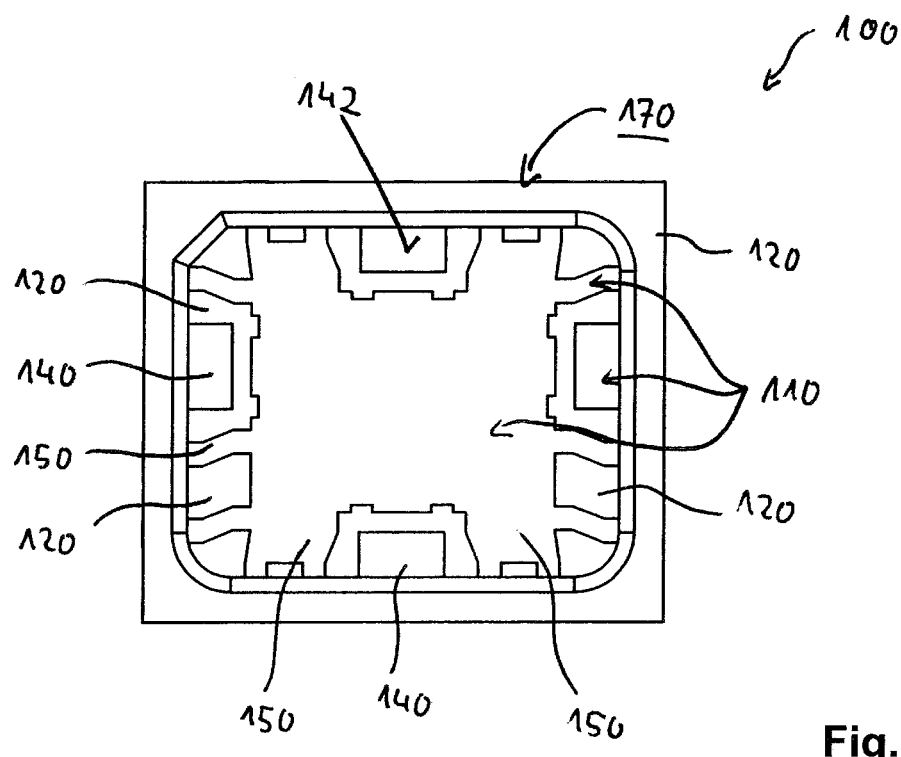
FIG. 1 shows a top view of an embodiment of a flat no-leads package according to the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

Figure 2:
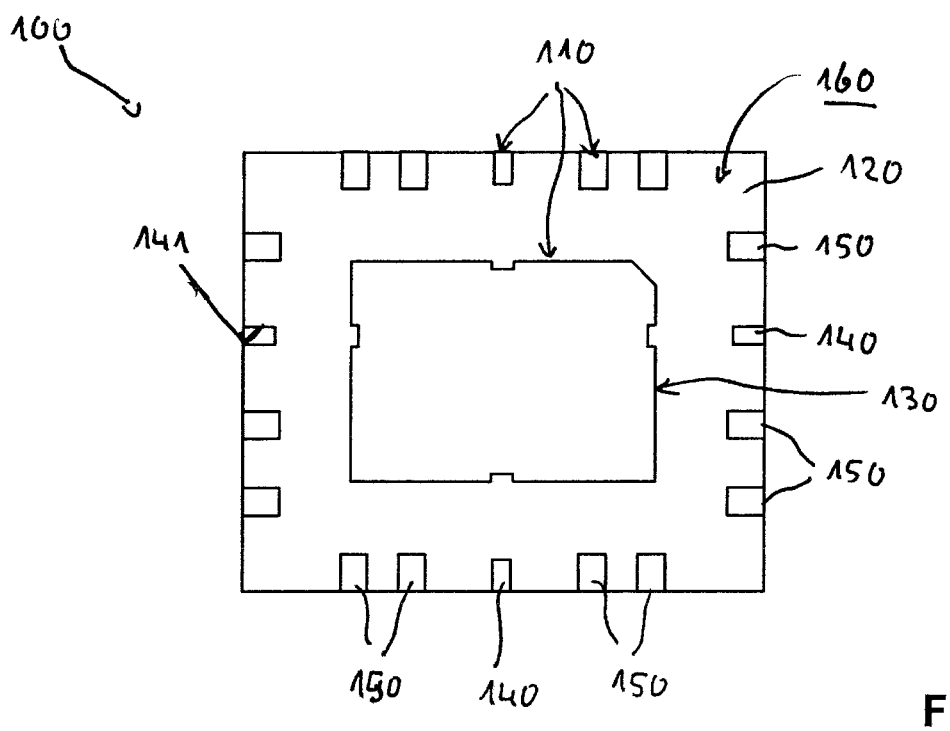
FIG. 2 shows a bottom view of the package shown in FIG. 1.

FIGS. 1 and 2 show a top view and a bottom view, respectively, of an embodiment of a flat no-leads package according to the invention.

The flat no-leads package—hereinafter shortly referred to as package—is denoted by reference numeral 100. The package 100 is comprised of a leadframe 110 and an isolating encapsulation 120.

The isolating encapsulation 120 is at least partially encapsulating the leadframe 110 such that contact surfaces (or contact pads of the leadframe 110 are electrically contactable at least from a bottom side of the package 100. FIG. 2 illustrates the resulting footprint of the package 100 showing the exposed contact surfaces of the leadframe 110.

In the embodiment shown in FIGS. 1 and 2, the package 100 has a substantially rectangular shape having four edges and a basically flat rectangular bottom side 160. However, it should be noted that no-leads package types having a quadratic shape are also possible and still fall under the scope in the sense of this invention. Those no-leads packages 100 are also referred as quad flat no-leads (QFN) packages 100.

The leadframe 110 of the package 100 consists of a conductive substrate or comprises a substrate that is at least partially covered by a conductive material. Typically, the leadframe 110 consists or comprises copper or a copper-based alloy. However, also other conductive materials or alloys for the leadframe are possible, such as sheet metal, aluminum, etc. In one embodiment, the leadframe 110 includes a generally quadrangular (e.g., square) die pad 130 defining four peripheral edge segments and a plurality of conductive leads 140, 150. The conductive leads 140, 150 are disposed spaced apart from the die pad 130 and are extending generally perpendicularly from a corresponding one of the peripheral segments of the die pad 130. It is to be understood that the leadframe 110 may include more or fewer leads 140, 150 than illustrated in the present embodiment of FIGS. 1 and 2.

In another embodiment (not shown in FIGS. 1 and 2), the package 100 does not comprise conductive leads 140, 150 on all of the four sides of the package 100. For example, it may be possible that the conductive leads 140, 150 are only on two sides of the package 100, for example on two opposite sides.

The leadframe 110 is configured to electrically connect an integrated circuit (IC) chip which in a mounted configuration is arranged on the die pad 130 (see FIGS. 5 and 7) to the conductive leads 140, 150. The conductive leads 140, 150 act as external contact connections.

In accordance with the present embodiment, the leadframe 110 comprises a plurality of RF lead pins 140 and a plurality of leadframe ground pins 150. In the embodiment shown in FIGS. 1 and 2, one RF lead pins 140 and a plurality of leadframe ground pins 150 are arranged on each side of the package 100, wherein the RF lead pins 140 are each arranged in the middle of a side of the package 100 and are each flanked by at least two of the adjacently arranged leadframe ground pins 150.

According to the invention, the RF lead pins 140 have a special 3-dimensional shape and structure. In particular, each of the RF lead pins 140 have a first contact surface 141 for providing an external contacting and a second contact surface 142 for enabling an internal wire bonding to an IC chip inside the package 100. The first contact surface 141 and the second contact surface 142 are in different levels of the package 100. Preferably, the first contact surface 141 which is part of the footprint basically corresponds to the bottom plane of the package 100. The second contact surface 142 is basically in a plane corresponding to the top plane of the IC chip mounted on the die pad 130 of the package 100.

According to the invention, a cross-section of such a RF lead pin 140 increases from the first contact surface 141 to the second contact surface 142. It is important to note that the enlargement of the of the cross-section of such a RF lead pin 140 takes place as well in a horizontal direction and in a direction vertical thereto. In this way, RF lead pins 140 are widening, i.e. they become as well larger and wider into the direction to the center portion of package 100. This will be shown in more detail in the following FIGS. 3 and 4.

Figure 3:
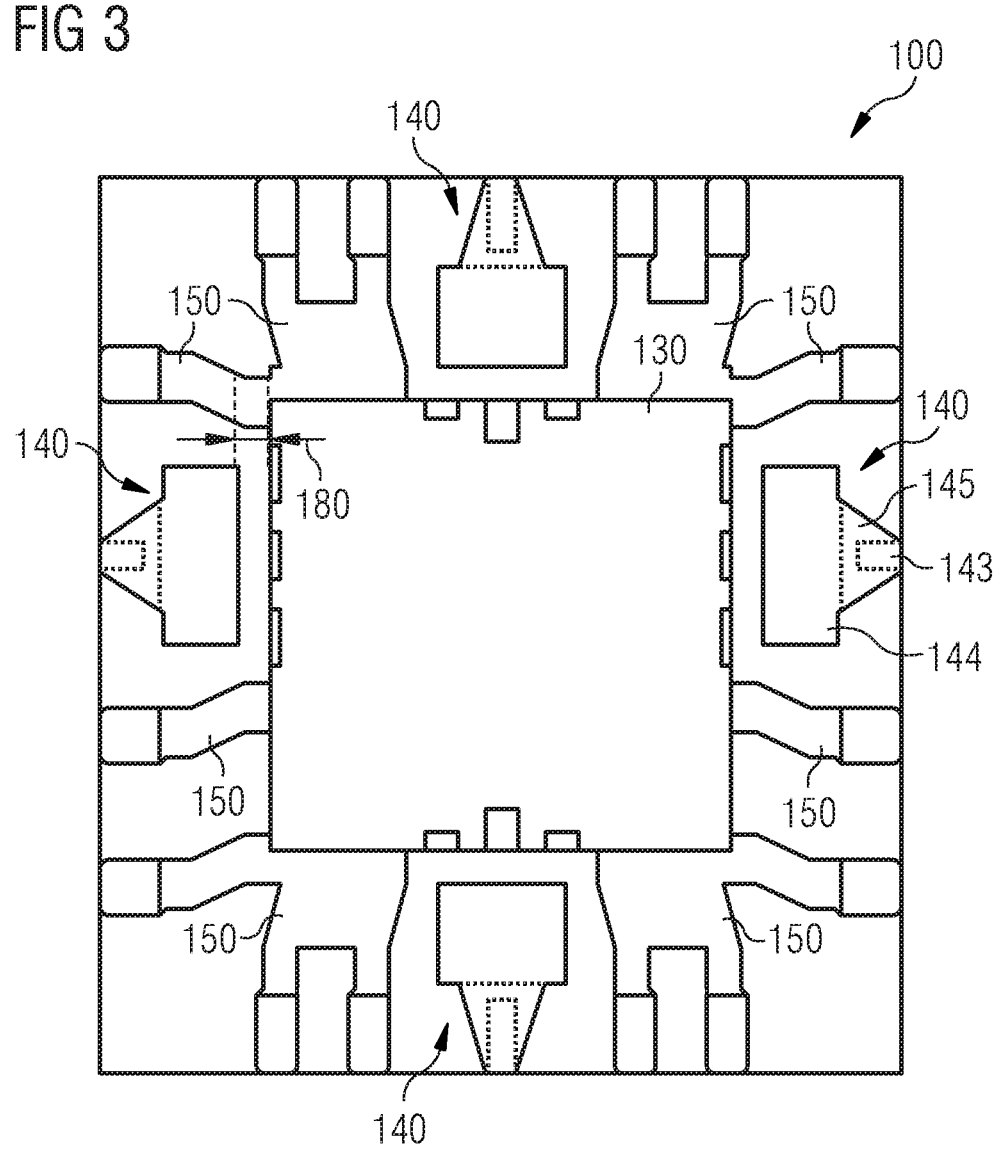
FIG. 3 shows a cross-sectional top view through an embodiment of the package shown in FIG. 1.
Figure 4:
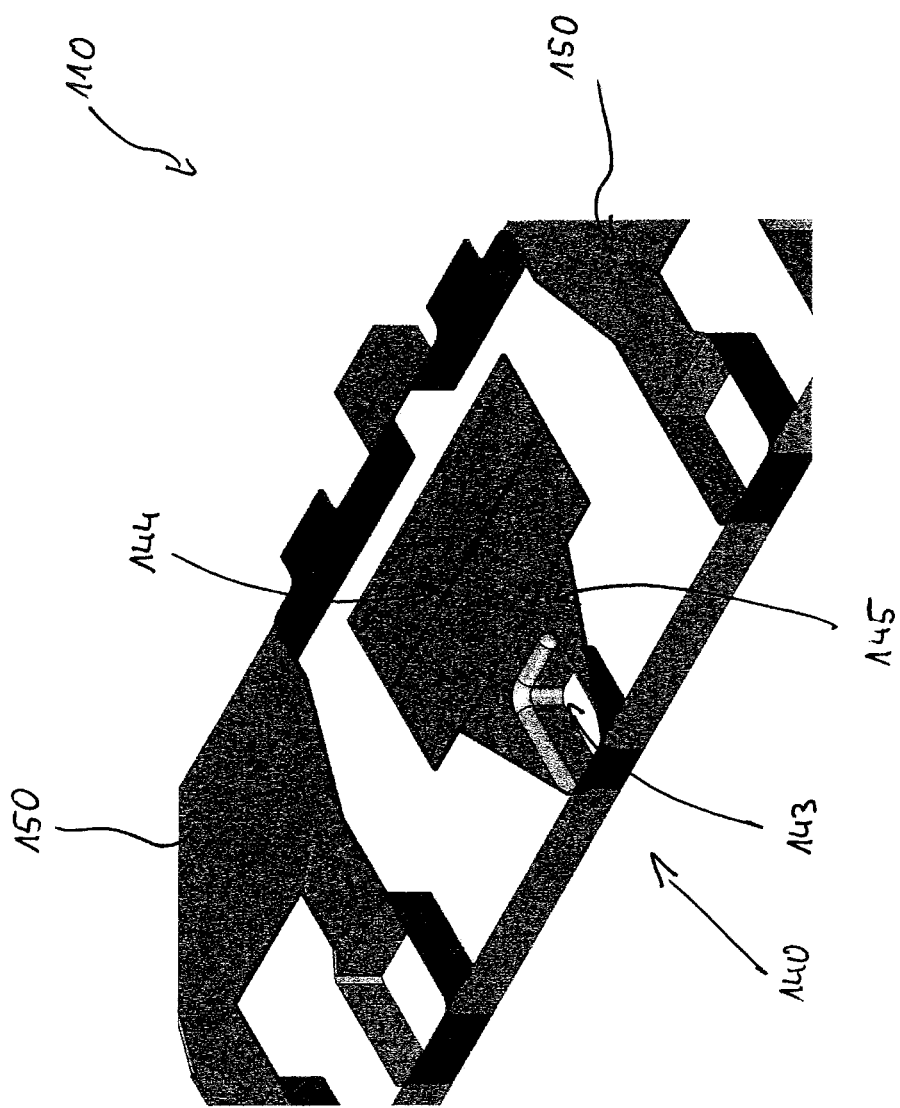
FIG. 4 shows in a perspective view an excerpt from FIG. 3.

FIG. 3 shows a cross-sectional top view through an embodiment of a package 100, such as shown in FIG. 1, in the plane of a vertical transition of the RF lead pin 140. FIG. 4 shows in a perspective view an excerpt of FIG. 3.

As can be seen from FIGS. 3 and 4, the RF lead pin 140 is not evenly formed. Rather, the RF lead pin 140 is constructed in a step-wise manner with several portions and transition portions between these portions. The different portions of the RF lead pin 140 form a one-piece part.

In an embodiment, the RF lead pin 140 is comprised of a first portion 143, a second portion 144 and a third portion 145.

The first portion 143 is arranged at an outer side of the RF lead pin 140. The first portion 143 comprises the first contact surface 141 and is designed to provide via the first contact surface 141 an electrical contactibility to a printed circuit board or any other substrate (see FIG. 7).

The second portion 144 is arranged at an inner side of the RF lead pin 140. The second portion 144 comprises the second contact surface 142 for providing wire bond contactibility from the RF lead pin 140 to a corresponding bond pad of an IC chip mounted on the die pad 130 of the package 100.

The first portion 143 exhibits a smaller cross-sectional area 144 than the second portion 144 and as such the first contact surface 141 is significantly smaller than the comparably large second contact surface 142.

Finally, a hard edge or step between the first and second portion 142, 143 is avoided by means of the third portion 145 which acts as a coupling portion. The third portion 145 is electrically arranged between and electrically coupling the first portion 143 with the second portion 144.

According to the present invention, the leadframe 110 is structured on at least two levels 111, 112. The lowest level 111 forms the interface between the package 100 and the PCB. This lowest level 111 which basically comprises the first portion 143 may look similar to a standard footprint, such as a footprint of a standardized flat no-leads package 100. Using such conventional footprints makes the package 100 fully compatible with conventional, standardized and common assembly techniques: Using leads protected by solder resist allow a self-alignment process of the package 100 during soldering. Standard assembly and soldering processes can be used either as well as standard test methods and sockets for those packages 100.

The flat no-leads packages 100 are typically constructed in matrices (e.g. 4×4) so that bond wedge wire bonding techniques can be used as a link between the leads 140, 150. By employing fast automated wire bonding assembly, the manufacturing of the packages 100 are particularly cost effective.

The optimized structuring of the upper level 112 of the leadframe 110 allows the compensation—or at least a significant reduction—of the impact of the inductances induced by the wire bond connections and thus a significant improvement of the RF properties (e.g., up to more than 40 GHz). An optimum compensation is preferably as close as possible to the point of a potential failure or disruption, which in the present situation is typically the wire bond interface.

FIGS. 5 and 6 show different perspective views of an embodiment of a packaged electronic component according to the invention.

The packaged electronic component 200 may be any kind of component, such as a IC chip, an RF integrated circuit or device, a memory, a microprocessor, an antenna (such as an RF antenna), an antenna device, an RF filter, a controller (such as a microcontroller, fuzzy controller, DSP, etc.).

The packaged electronic component 200 basically comprises a package 100, e.g. such as described in more detail in combination with FIGS. 1-4, and an IC chip 210. The IC chip 210 is located in a center portion of the packaged electronic component 200. In particular, the IC chip 210 is mounted on the die pad 130 of the leadframe 110 of the package 100. In the present embodiment, the die pad 130 is made of a thermally conductive material and is configured to transfer temperature from the IC chip 210 via the die pad 130 to a heat sink (not shown in FIGS. 5 and 6). This heat sink may be part of a PCB. This is in particular preferred for applications (such as RF applications) where the IC chip 210 produces significant heat which needs to be removed or transferred from the IC chip 210 in order to prevent overheating of the IC chip 210.

In another embodiment, the die pad 130 may also form a backside contact of the IC chip 210. In still another embodiment, the die pad 130 may be connected to ground potential or any other predefined potential.

The leads 140, 150 are electrically coupled to corresponding pads 240, 250 on the IC chip 210 via a plurality of wire bonds 220, 230 (sometimes also denoted as bond wires). In the embodiment shown in FIG. 5, each of the RF lead pins 140 is coupled to a corresponding pad 240 on the IC chip 210 via three wire bonds 220. It may also be possible to use only one or two wire bonds 220 for connecting the RF lead pins 140. Using three or more wire bonds 220 is advantageous since the parallel arrangement of the three or more wire bonds 220 is reducing the effect of the parasitic inductances induced by the wire bonds 220.

In order to minimize the wire bond inductances, the associated RF lead pin 140 is arranged as close as possible to the IC chip 210. Depending on the progress of the backend technology, a minimum distance of 250 µm (gap 180) between the outer edge of the IC chip 210 and the inner edge of RF lead pin 140 is possible with the currently used process technology. This minimum distance is limited by the currently used manufacturing technology and the positioning accuracy of the chip assembly.

For the purpose of further minimizing the parasitic inductances, a plurality of wire bonds 220 (e.g., three wire bonds 220) are used to contact the RF pad 240 on the IC chip 210 with the corresponding contact surface 142 on the RF lead pin 140.

For the purpose of further minimizing the parasitic inductances, these wire bonds 220 are preferably applied as flat as possible in order to reduce material and as such lower the inductances caused by the wire bonds 220.

Due to the usage of three wire bonds 220, the overall inductance is reduced to one third (in case the length of the wire bonds is the same). This reduction is partially compensated by magnetic field couplings, resulting in an inductance of the wire bond 220 of about 0.150 pH. The wire bonds 220 are then connected to the leadframe 110 by magnetic field couplings. Compared to a single wire bond 220, the three wire bonds 220 span a larger area, which in combination with the leadframe 110 exhibits a larger capacitance. The resulting benefit of this measure is that this capacitance acts against the inductance of the wire bond 220. As such, this configuration compensates—or at least significantly reduces—the impact of the inductance with the capacitance of the contact surface 142 of the RF lead pin 140.

This would also be feasible with a two-wire bond configuration (so called V-bonds) and other leadframes.

The compensation of the wire bond inductance is performed according to the present invention basically by a widened contact surface 142 of the RF lead pin 140. This contact surface 142 of the RF lead pin 140 offers a very low shunt capacitance (e.g., of about 40 fF) against ground potential (GND). With the counterpart contact pad 240 on the IC chip 210, a compensated C1-L2-C3 structure with low-pass characteristics results, with C1 is the capacitance caused by the contact on the leadframe 110, L2 is the inductance caused by the wire bond 220 and C3 is the capacitance caused by the contact on the IC chip 210. This simplified C1-L2-C3 structure with low-pass characteristics enables a very low insertion loss at high frequencies (e.g., less than 1 dB up to 50 GHz).

According to one additional embodiment, parallel flat wire bonds 223 connect adjacent leadframe ground pads of a ground-signal-ground (GSG) pad structure to the GND of the package 100 in order to ensure a low inductance GND connection. The GND connection is further improved by the fact that ground pads are connected to a ground pad on the backside of the IC chip 210 only on the upper level 112 of the leadframe. This measure minimizes the inductive and resistive components in the reverse current path.

The lower level 111 of the leadframe 110 remains basically standard compliant and outwardly forms a standard compatible footprint for the packages 100.

FIG. 7 shows a cross-sectional side view of a packaged electronic component 200 mounted on an insulating plate 300. The insulating plate 300 is in this embodiment a suitably structured printed circuit board (PCB) 300. The packaged electronic component 200 which can look like the component illustrated in FIGS. 5 and 6 is electrically connected to the PCB 300 via suitable electrical connections, such as solder connections 310, 320.

In FIG. 7, the different levels ## of the leadframe 110 as well as of the RF lead pins 140 is illustrated. In particular, the multi-level structure of the RF lead pins 140 is shown there either. Note, that the grey shaped RF lead pin 140 in the middle of the leadframe 110 is a projection, as this RF lead bin 140 is further back. It is shown in FIG. 7, however, in order to not only show the side structure of an RF lead pin 140 (see left pins 140), but also the frontal view on this RF lead pin 140.

The IC chip 210 is mounted with its backside surface 211 to the die pad 130 in a center portion of the flat no-leads package 100. The mounting is done by means of an adhesive layer 330. In an embodiment, the adhesive layer 330 is a thermally conductive layer 330 which is configured such to transfer heat from the IC chip 210 via its backside surface 211, the adhesive layer 330 and the leadframe ground 340 to a heat sink 350 which may be part of the PCB 300 or which may be thermally coupled to the PCB 300.

FIG. 8 shows a block diagram of an embodiment of a measurement device according to the invention. The measurement device 400 comprises a packaged electronic component 200 having a flat no-lead package 100 according to the invention. The measurement device 400 may be a RF measurement device for RF measurement, such as a spectrum analyzer, a network analyzer, an electronic test equipment, e.g. for microwave links as well as for radar and satellite communications systems, an EMC systems, devices for field strength testing, etc.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals, current and voltage from or to the respective elements, units or devices.

Because the IC chip used in the present invention are, for the most part, composed of electronic components and circuits known to those skilled in the art, details of this circuitry and its components will not be explained in any greater extent than that considered necessary as illustrated above, for the understanding and appreciation of the underlying concepts of the present invention and in order not to obfuscate or distract from the teachings of the present invention.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." This applies for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention.

Although the present description tends to use leadframe type substrates, it is understood that the present disclosure is applicable as well to other types of substrates, including, but not limited to laminate substrates and other substrates as known to those of ordinary skill in the art. Additionally, reference is made throughout the present description to an electronic component, electronic device, or electronic chip, which can be a semiconductor integrated circuit ("IC"), such as a mixed signal IC, an RF device, a microcontroller, a power semiconductor device, such as an RF power transistor, other types of logic and/or analog devices or integrated functionality, integrated passive capability, application specific ICs ("ASICs"), and other types of similar semiconductor devices as known to those of ordinary skill the art. Electronic component can provide control, monitoring, filtering, amplification, powering and other functionality to the integrated antennas described hereinafter, or electronic component can be isolated and/or independent from functions required to control, monitor, power, or otherwise interact or electrically communicate with the integrated antenna. However, in some embodiments, it is preferable for electronic component to electrically communicate with the integrated antenna device to provide space efficient packaged devices in accordance with the present disclosure.

LIST OF REFERENCE SIGNS 100 flat no-lead package, QNF package
110 leadframe
111 lower level (of leadframe)
112 upper level (of leadframe)
120 isolating encapsulation
130 die pad
140 leads, RF lead pins
141 first contact surface (of RF lead pin)
142 second contact surface (of RF lead pin)
143 first portion (of RF lead pin)
144 second portion (of RF lead pin)
145 third portion (of RF lead pin)
150 conductive leads, leadframe ground pins
160 bottom side
170 top side
180 gap
200 packaged electronic component
210 IC chip
211 backside surface
220 wire bonds
230 wire bonds
240 pad
250 pad
300 insulating plate, printed circuit board (PCB)
310 electrical connection, solder connection
320 electrical connection, solder connection
330 adhesive layer
340 leadframe ground
350 heat sink
400 measuring device

The invention claimed is:

1. A flat no-leads package, the flat no-leads package comprising:
a leadframe for electrically connecting an integrated circuit (IC) chip which in a mounted configuration is arranged in a center portion of the flat no-leads package, the leadframe comprising one or more RF lead pins; and
an isolating encapsulation which is at least partially encapsulating the leadframe such that contact surfaces of the leadframe are electrically contactable at least from a bottom side of the flat no-leads package;
wherein at least one of the one or more RF lead pins has a first contact surface for providing an external contacting on the bottom side of the flat no-leads package and a second contact surface for enabling an internal wire bonding to an IC chip inside the flat no-leads package; and
wherein the cross-section of the at least one of the one or more RF lead pins increases from the first contact surface to the second contact surface both in a horizontal direction and in a direction vertical thereto:
wherein the at least one or more RF lead pin of the leadframe is comprised of:
a first portion at an outer side of the at least one or more RF lead pin which is designed to provide via the first contact surface an electrical contactibility,
a second portion at an inner side of the at least one or more RF lead pin which comprises the second contact surface for providing a wire bond contactibility from the at least one or more RF lead pin to a corresponding bond pad of an IC chip mounted inside the flat no-leads package, wherein the first portion exhibits a smaller cross-sectional area than the second portion; and
a third portion electrically arranged between and electrically coupling the first portion with the second portion;
wherein the third portion has a trapezoidal shape, wherein the longer side of the both parallel sides of the trapezoidal shaped third portion is bordering alongside the second portion and the shorter side of the both parallel sides of the trapezoidal shaped third portion is bordering alongside the first portion.

2. The flat no-leads package of claim 1, wherein at least one of the first portion and second portion has a basically rectangular shape.

3. The flat no-leads package of claim 1, wherein at least one of the first portion and second portion has at least one rounded corner.

4. The flat no-leads package of claim 1, wherein the isolating encapsulation is encapsulating the leadframe such that only the first portion of the leadframe is electrically contactable from the bottom side of the package.

5. The flat no-leads package of claim 1, wherein the leadframe further comprising at least one leadframe ground pin which is arranged adjacent to at least one of the one or more RF lead pins.

6. The flat no-leads package of claim 1, wherein a gap between the leadframe ground pin and the one or more RF lead pins is filled with the same material of the isolating encapsulation.

7. The flat no-leads package of claim 1, wherein the material of the isolating encapsulation at least partially comprises plastic.

8. The flat no-leads package of claim 1, wherein the isolating encapsulation is injection moulded.

9. The flat no-leads package of claim 1, wherein the flat no-leads package is a quad flat no-leads (QNF) package.

10. The flat no-leads package of claim 9, wherein the QNF package is an air cavity quad flat no-leads (AQNF) package.

11. The flat no-leads package of claim 10, wherein the isolating encapsulation of the AQNF package comprises a lid and wherein the lid is made of ceramic.

12. A packaged electronic component, the packaged electronic component comprising:
a flat no-leads package, the flat no-leads package comprising:
a leadframe for electrically connecting an IC chip comprising one or more RF lead pins and at least one leadframe ground pin,
an isolating encapsulation which is at least partially encapsulating the leadframe such that contact surfaces of the leadframe are electrically contactable at least from a bottom side of the flat no-leads package; and
an IC chip arranged at least partially within the isolating encapsulation, mounted in a center portion of the flat no-leads package and electrically connected via wire bonds to the leadframe;
wherein at least one of the one or more RF lead pins has a first contact surface for providing an external contacting on the bottom side of the flat no-leads package and a second contact surface for enabling an internal wire bonding to the electronic circuit inside the flat no-leads package; and
wherein the cross-section of the at least one of the one or more RF lead pins increases from the first contact surface to the second contact surface both in a horizontal direction and in a direction vertical thereto;

wherein the at least one or more RF lead pin of the leadframe is comprised of:

a first portion at an outer side of the at least one or more RF lead pin which is designed to provide via the first contact surface an electrical contactibility, a second portion at an inner side of the at least one or more RF lead pin which comprises the second contact surface for providing a wire bond contactibility from the at least one or more RF lead pin to a corresponding bond pad of an IC chip mounted inside the flat no-leads package, wherein the first portion exhibits a smaller cross-sectional area than the second portion; and a third portion electrically arranged between and electrically coupling the first portion with the second portion;

wherein the third portion has a trapezoidal shape, wherein the longer side of the both parallel sides of the trapezoidal shaped third portion is bordering along-side the second portion and the shorter side of the both parallel sides of the trapezoidal shaped third portion is bordering alongside the first portion.

13. The packaged electronic component of claim 12, wherein at least one of the one or more RF lead pins is electrically connected via the second surface to a corresponding bond-pad of the IC chip by means of at least three wire bonds.

14. A printed circuit board (PCP), the PCB comprising:
an insulating plate;
at least one flat no-leads package mounted on the insulating plate, the flat no-leads package comprising:
  a leadframe for electrically connecting an IC chip which in a mounted configuration is arranged in a center portion of the flat no-leads package, the leadframe comprising one or more RF lead pins; and
  an isolating encapsulation which is at least partially encapsulating the leadframe such that contact surfaces of the leadframe are electrically contactable at least from a bottom side of the flat no-leads package;
  wherein at least one of the one or more RF lead pins has a first contact surface for providing an external contacting on the bottom side of the flat no-leads package and a second contact surface for enabling an internal wire bonding to an electronic circuit inside the flat no-leads package; and
  wherein the cross-section of the at least one of the one or more RF lead pins increases from the first contact surface to the second contact surface both in a horizontal direction and in a direction vertical thereto;
  wherein the at least one or more RF lead pin of the leadframe is comprised of:
  a first portion at an outer side of the at least one or more RF lead pin which is designed to provide via the first contact surface an electrical contactibility,
  a second portion at an inner side of the at least one or more RF lead pin which comprises the second contact surface for providing a wire bond contactibility from the at least one or more RF lead pin to a corresponding bond pad of an IC chip mounted inside the flat no-leads package, wherein the first portion exhibits a smaller cross-sectional area than the second portion; and
  a third portion electrically arranged between and electrically coupling the first portion with the second portion;
  wherein the third portion has a trapezoidal shape, wherein the longer side of the both parallel sides of the trapezoidal shaped third portion is bordering alongside the second portion and the shorter side of the both parallel sides of the trapezoidal shaped third portion is bordering alongside the first portion.

15. A measurement device comprising at least one flat no-leads package, the flat no-leads package comprising:
a leadframe for electrically connecting an IC chip which in a mounted configuration is arranged in a center portion of the flat no-leads package, the leadframe comprising one or more RF lead pins; and
an isolating encapsulation which is at least partially encapsulating the leadframe such that contact surfaces of the leadframe are electrically contactable at least from a bottom side of the flat no-leads package;
wherein at least one of the one or more RF lead pins has a first contact surface for providing an external contacting on the bottom side of the flat no-leads package and a second contact surface for enabling an internal wire bonding to an electronic circuit inside the flat no-leads package; and
wherein the cross-section of the at least one of the one or more RF lead pins increases from the first contact surface to the second contact surface both in a horizontal direction and in a direction vertical thereto;
wherein the at least one or more RF lead pin of the leadframe is comprised of:
a first portion at an outer side of the at least one or more RF lead pin which is designed to provide via the first contact surface an electrical contactibility,
a second portion at an inner side of the at least one or more RF lead pin which comprises the second contact surface for providing a wire bond contactibility from the at least one or more RF lead pin to a corresponding bond pad of an IC chip mounted inside the flat no-leads package, wherein the first portion exhibits a smaller cross-sectional area than the second portion; and
a third portion electrically arranged between and electrically coupling the first portion with the second portion;
wherein the third portion has a trapezoidal shape, wherein the longer side of the both parallel sides of the trapezoidal shaped third portion is bordering alongside the second portion and the shorter side of the both parallel sides of the trapezoidal shaped third portion is bordering alongside the first portion.

* * * * *